United States Patent [19]

Dietz

[11] Patent Number: 4,980,583
[45] Date of Patent: Dec. 25, 1990

[54] CMOS LEVEL SHIFT CIRCUIT WITH ACTIVE PULL-UP AND PULL-DOWN

[75] Inventor: Paul H. Dietz, Pittsburgh, Pa.

[73] Assignee: National Semiconductor Corporation, Santa Clara, Calif.

[21] Appl. No.: 292,809

[22] Filed: Jan. 3, 1989

[51] Int. Cl.[5] .......................................... H03K 17/693
[52] U.S. Cl. .................................... 307/475; 307/451; 307/272.1
[58] Field of Search ............... 307/443, 451, 452, 475, 307/264, 272.1

[56] References Cited

U.S. PATENT DOCUMENTS

| 4,532,436 | 7/1985 | Bismarck | 307/475 X |
| 4,656,373 | 4/1987 | Plus | 307/451 X |
| 4,672,243 | 6/1987 | Kirsch | 307/443 X |
| 4,695,744 | 9/1987 | Giordano | 307/264 X |
| 4,703,199 | 10/1987 | Ely | 307/475 X |
| 4,717,836 | 1/1988 | Doyle | 307/475 X |
| 4,845,381 | 7/1989 | Cuevas | 307/475 X |

Primary Examiner—David Hudspeth
Attorney, Agent, or Firm—Lee Patch; James W. Rose

[57] ABSTRACT

A CMOS level shift circuit with active pull-up uses a pair of pull up transistors activated during the period when an output node needs to be rapidly pulled up. The pull up transistors are activated by the outputs of a combinatorial logic or memory circuit detecting when a change of input signal has occurred and activating the respective pull up transistor to bring the output to the proper state.

5 Claims, 3 Drawing Sheets

CMOS LEVEL SHIFT CIRCUIT WITH ACTIVE PULL-UP AND PULL-DOWN

FIELD OF THE INVENTION

This invention relates to an electronic circuit. This level shift circuit converts a digital input signal that switches over a small voltage range into an output signal that switches over a large voltage range. This circuit is suitable for fabrication by CMOS processes. This circuit receives an input signal and its complement and produces an output signal and its complement. This invention provides improved rise and fall times for its output signals.

DESCRIPTION OF THE PRIOR ART

A level shift circuit converts a digital input signal that switches over a small voltage range into an output signal that switches over a large voltage range. For example, if a signal can only rise over a limited voltage range, e.g. 0–3.0 volts, a level shift circuit can be used to convert this small rise in input voltage into a larger rise in output voltage, e.g. 0–5.0 volts.

In digital logic circuits a low voltage level of 0–1.0 volts might represent a digital logic low or "0" state, while a high voltage level of 4.0–5.0 volts might represent a digital logic high or "1" state. Voltage levels outside these ranges are indeterminate and represent noise or an erroneous signal. A level shift circuit may be used to convert an input signal that switches over a low voltage range to an output signal that switches over the proper larger voltage range suitable for recognition by the elements of a digital logic system.

When fabricated by CMOS processes, a level shift circuit can recognize a rise in input level when the rise is enough to cross the the threshold voltage of a MOSFET transistor, e.g. 0.6 volts. The switching of the transistor may then be used to switch an output signal over a larger voltage range, e.g. 0–5.0 volts. It is desirable that the switching action occur as quickly as possible, so that the output signal is not in the indeterminate region where neither a logic 0 state or logic 1 state is recognized.

A circuit known in the art for providing this level shift operation is shown in FIG. 1. The circuit has two inputs for an IN signal and its complement $\overline{IN}$. The circuit has two output nodes OUT and its complement $\overline{OUT}$. The circuit has two complementary legs.

A first leg is connected from ground up through a first n-channel input transistor T1 to an output node $\overline{OUT}$. From the output node $\overline{OUT}$ the first leg continues up through a first p-channel hold transistor T3 to a positive voltage source.

A second leg is connected from ground up through a second n-channel input transistor T2 to an output node OUT. From the output node OUT, the second leg continues up through a second p-channel hold transistor T4 to a positive voltage source.

The first input transistor T1 is driven by the IN signal. The second input transistor T2 is driven by the $\overline{IN}$ signal.

The first hold transistor T3 is driven from the output node on the opposite leg, the OUT node. The second hold transistor T4 is driven from the output node on the opposite leg, the $\overline{OUT}$ node. This cross coupled configuration holds the circuit in a stable high or low condition once the state is reached.

The waveforms of the IN and $\overline{OUT}$ signals during a switching operation are illustrated in FIG. 2.

When the IN signal is low, the $\overline{IN}$ signal is high. Transistor T1 will be off and acts to disconnect the $\overline{OUT}$ node from ground, so that it can be held high by transistor T3. T2 will be on and conducting and will pull-down the OUT node to a low level.

With the OUT node low, the conduction of transistor T3 will be enhanced which will hold the $\overline{OUT}$ node high. With the $\overline{OUT}$ node high, T4 will be off, and acts to disconnect the OUT node from the positive voltage source.

Now consider a change in signal, as shown at time A in FIG. 2. As the IN signal goes high, T1 begins to conduct and pull-down the $\overline{OUT}$ node. As the $\overline{IN}$ signal goes low, the pull-down of the OUT node by T2 ends and OUT can begin to move toward a high level. Only a small change in input signal, enough to cross the threshold voltages of transistors T1 and T2, is needed to switch the output nodes over a larger voltage range between ground and the level of the positive voltage source.

As $\overline{OUT}$ moves low, it helps OUT rise by raising the conduction of T4. As OUT rises, it helps $\overline{OUT}$ fall by reducing the conduction of T3. This mutually assisting operation means that the fall of the $\overline{OUT}$ node is quite rapid. A similar mutually assisting operation occurs when the OUT signal is falling from a high to a low level.

However, the rise time of either the OUT or $\overline{OUT}$ nodes is not assisted by such a mutually beneficial action. The rise time is longer for several reasons. First, the hold transistor, T3 or T4, is not fully conducting until after the pull down of the opposite node is complete. Second, the input transistors, T1 and T2, have stored charge that must be removed by the hold transistors. Third, the hold transistors may saturate when turned "on" which limits their current sourcing while pulling the node high. And lastly, the hold transistors must be designed to source only a limited amount of current, in order for their current to be overcome by the current through T1 and T2 when the circuit is changing state. The eventual signal levels are correct, but the slow rate of rise is undesirable.

If the input transistors T1 and T2 are made larger, the fall time of $\overline{OUT}$ or OUT can be reduced. This is because a larger input transistor will be able to pull-down the node low more rapidly. However, the rise time of either node gets proportionately longer. This is because the larger input transistors will have greater stored charge to be removed by the relatively smaller hold transistors. Merely increasing the size of the hold transistors to counter this will also counter the improvements just achieved in pull down, as well as requiring more semiconductor die area. A method of improving the rise and fall times of the output nodes is desired wherein the improvement in one time does not degrade the other time.

SUMMARY OF THE INVENTION

This invention provides a level shift circuit with reduced switching time. The output signals will reach their correct logic values sooner, reducing the probability of an erroneous logic condition occurring.

This invention assists the hold transistors with additional pull-up and pull-down transistors that are turned on at proper times to force the circuit rapidly to the proper state. The sequencing of these transistors may be controlled by a combinatorial logic circuit. The logic circuit will also keep the transistors off until needed, and therefore will keep quiescent current consumption low.

DESCRIPTION OF THE PREFERRED EMBODIMENTS

Figure 1:
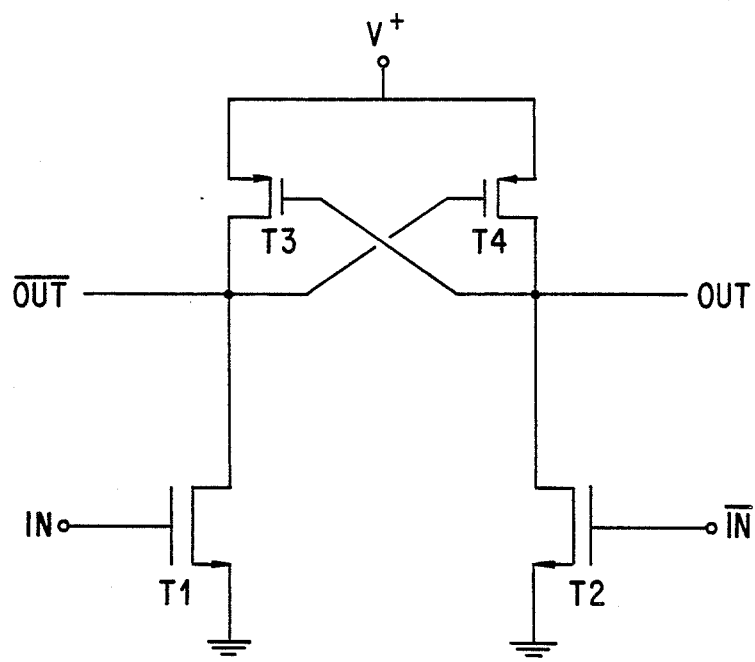
FIG. 1 shows a circuit known in the art for providing level shift.
Figure 2:
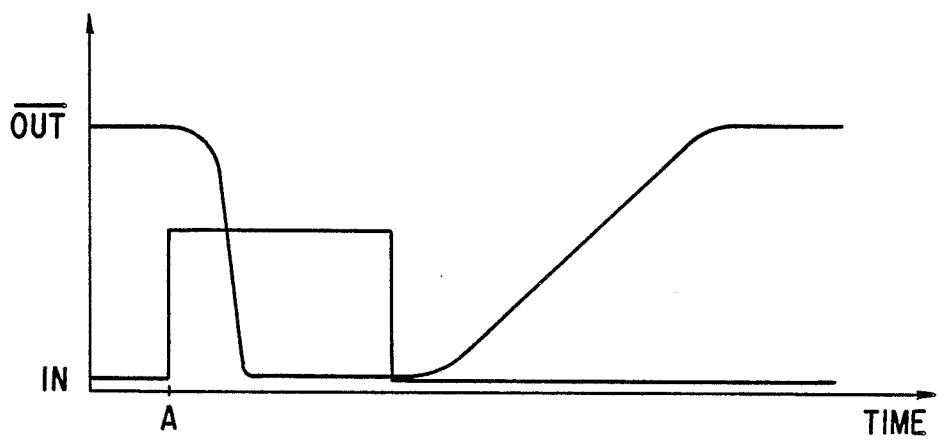
FIG. 2 illustrates the waveforms of the IN and $\overline{OUT}$ signals during a switching operation.
Figure 3:
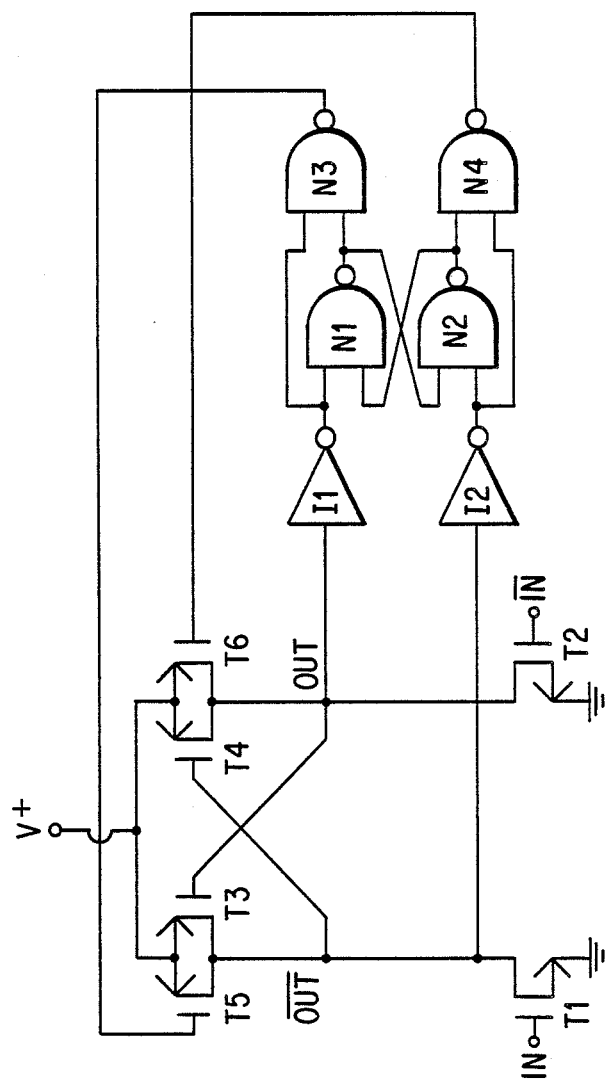
FIG. 3 shows a CMOS level shift circuit in accordance with the present invention.

A CMOS level shift in accordance with the present invention is shown in FIG. 3.

Two n-channel transistors T1 and T2, serve as input transistors for the IN signal and its complement $\overline{IN}$. Two small p-channel transistors, T3 and T4, serve to hold up the output nodes $\overline{OUT}$ and OUT.

Transistors T5 and T6 are relatively large p-channel pull-up transistors added in parallel respectively to the p-channel hold transistors T3 and T4. These added transistors, T5 and T6, act as more powerful pull-up transistors. For example, when the OUT node is moving high, T4 will not be completely turned on until the pull-down of $\overline{OUT}$ is complete. But T6 can be quickly activated to start the pull-up, joined by T4 later in time.

T5 and T6 may be controlled by the complementary outputs of a type of S-R flip-flop constructed from two inverters I1 and I2, and four cross-connected NAND gates, N1 through N4.

When IN is high and $\overline{IN}$ is low, T1 is on and T2 is off. T3 is off and $\overline{OUT}$ is low. T4 is on and OUT is high. Inverter I1 will convert the high OUT signal to a low signal. This low signal will be applied to the first inputs of NAND gates N1 and N3. Since at least one input is low, these gates will output a high signal. The high output of N1 will be cross connected to one of the inputs of N2. The high output of N3 is connected to T5 which will be off.

The low signal $\overline{OUT}$ is applied to inverter I2 which outputs a high signal. This high signal is applied to the first inputs of NAND gates N2 and N4. Since N2 has two high inputs it will output a low signal to the other input of N4. Since N4 has at least one low input it will output a high to T6 which will be off.

When the input signals change, for example, from IN high to IN low, and from $\overline{IN}$ low to $\overline{IN}$ high, the output signal needs to go from OUT high to OUT low and $\overline{OUT}$ low to $\overline{OUT}$ high. The pull-down of OUT is accomplished by switching T2 on by the $\overline{IN}$ signal going high. The pull-up of $\overline{OUT}$ will be accomplished by T5 switching on to assist T3 as follows. When T2 is switched on, it pulls OUT low. This is inverted in I1 to a high, which changes the output of N3 to a low. This will switch T5 on to rapidly perform the pull-up of $\overline{OUT}$. When $\overline{OUT}$ is high, it's high signal will be changed to low by I2, which will change the output of N2 to a high, which will change the output of N1 to a low, which switches N3 back to a high state and turns off the pull-up being performed by T5.

Therefore, N1 and N2 act as a 1-bit static memory cell to remember the last state of switching. When one side of the level shift circuit is pulled down by one of the input transistors both OUT and $\overline{OUT}$ will briefly be low, and the S-R flip-flop will be holding the last state. These signals are combined with the inverted outputs in the NAND gates N1–N4. This turns on one of the p-channel pull-up transistors T5 or T6. When the node is high up, the S-R flip-flop changes state, and turns off the pull-up transistor.

This circuit can also be analyzed as having first and second output nodes. Each node has an input transistor for pull-down to ground and a hold transistor for pull-up to a positive voltage. A first inverter is connected from the first output node to the first inputs of first and third NAND gates. A second inverter is connected from the second output node to the first inputs of second and fourth NAND gates.

The output of the first NAND gate is connected to the second inputs of the second and third NAND gates. The output of the second NAND gate is connected to the second inputs of the first and fourth NAND gates. The output of the fourth NAND gate is connected to control a first pull-up transistor connected for pull-up of the first output node to a positive voltage. The output of the third NAND gate is connected to control a second pull-up transistor connected for pull-up of the second output node to a positive voltage.

With these added pull-up transistors, the original small hold transistors are really only necessary to hold the circuit in the proper state against leakage and noise on the input signals. In a system which is constantly switching, they may not be needed. In such a system it may also be possible to change the switching logic to dynamic rather than static operation.

Figure 4:
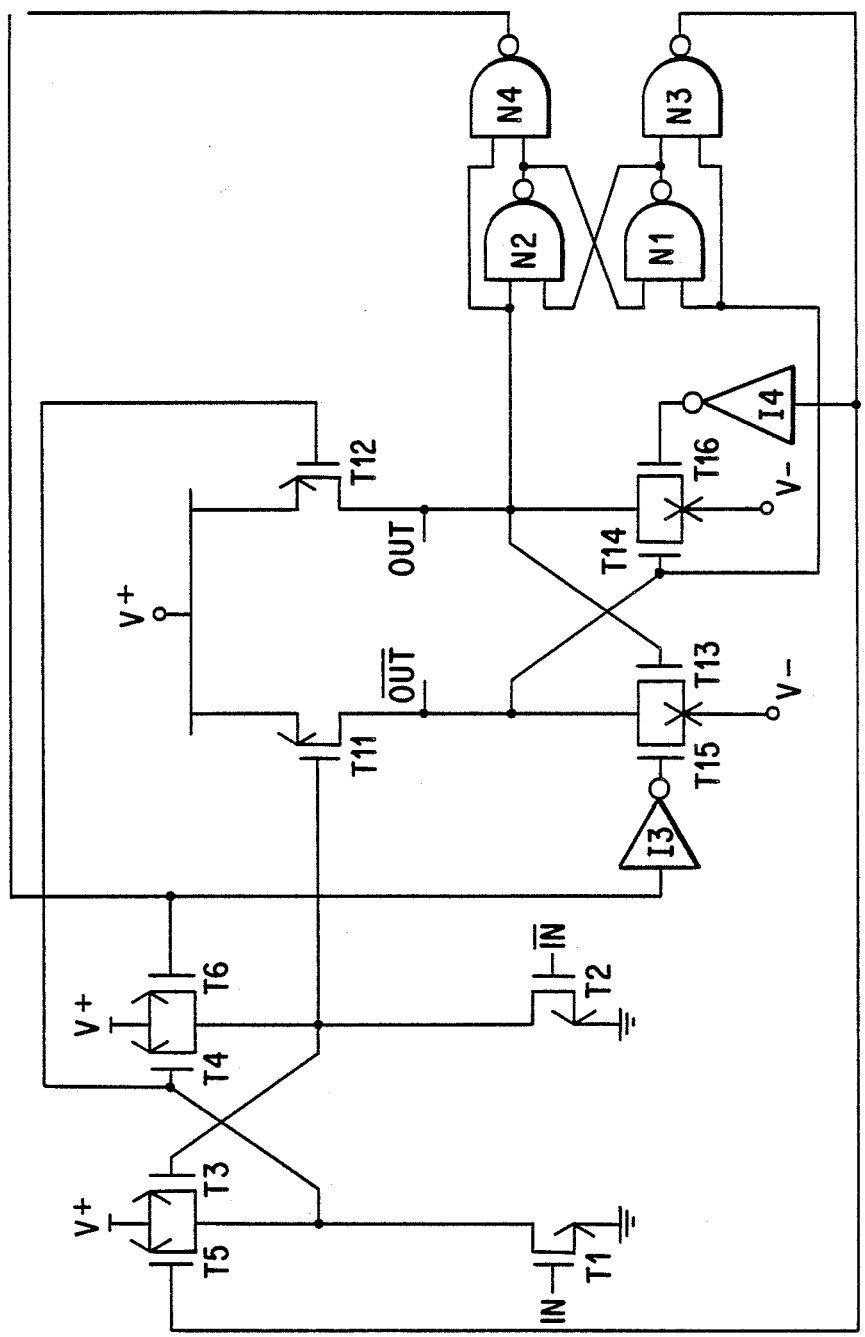
FIG. 4 shows a second embodiment of a CMOS level shift circuit in accordance wiht the present invention.

In a second embodiment as shown in FIG. 4, two additional complementary legs are added, separating the two original input legs from two new output legs.

A first new output leg has a small hold-down transistor T13, and a large pull-down transistor T15 activated through an inverter I3 in opposite phase to the pull-up. This first new output leg can be designed to switch to a negative voltage V- instead of just to ground.

A second new output leg has a small hold-down transistor T14, and a large pull-down transistor T16 activated through an inverter I4 in opposite phase to the pull-up transistor T5. This second new output leg can be designed to switch to a negative voltage V- instead of just to ground.

Each inverter I3 and I4 also provides a small delay so that T15 turns on slightly later than T6, and T16 turns on slightly later than T5. This reduces the peak current consumption from the power supply as the transistors turn on.

The first new output leg has a pull-up transistor T11 activated from the second original put leg node. The second new output leg has a pull-up transistor T12 activated from the first original input leg node.

Therefore, the first new output leg provides a $\overline{OUT}$ signal with pull-up by T11, and pull down by T15. The second new output leg provides a OUT signal with pull-up by T12, and pull down by T16.

Therefore, in this second embodiment each of the input nodes and each of the output nodes has an active pull-up and active pull-down. Each node can be tailored for optimal speed of rise and fall times. Thus, as in the first embodiment, one leg will be switching quickly with the mutually assisting operation previously described, and another leg will be pulled to the proper state by an active pull-up or pull-down.

Other variations of this invention will be apparent to those skilled in the art, and the scope of this invention is limited only by the following claims.

I claim:

1. A level shift circuit operating from ground to a supply voltage, comprising:
   first and second output transistors having respective first and second output nodes;
   first and second input transistors for pulling said first and second output nodes to ground;
   first and second upper transistors for pulling said first and second output nodes to a supply voltage;
   first, second, third and fourth NAND gates, each with first and second inputs and an output;
   first inverter connected from said first output node of said first output transistor to said first inputs of said first and third NAND gates;
   second inverter connected from said second output node of said second output transistor to said first inputs of said second and fourth NAND gates;
   said output of said first NAND gate connected to said second inputs of said second and third NAND gates;
   said output of said second NAND gate connected to said second inputs of said first and fourth NAND gates;
   said output of said third NAND gate connected to control said second upper transistor to pull said second output node of said second output transistor to said supply voltage; and
   said output of said fourth NAND gate connected to control said first upper transistor to pull said first output node of said first output transistor to said supply voltage.

2. A level shift circuit of claim 1 wherein said first and second input transistors are of a n-channel MOS type and said first and second upper transistors are of a p-channel MOS type.

3. A level shift circuit of claim 1 wherein said means to activate is a sequential logic circuit with an input from each of said first and second output nodes and an output to each of said first and second upper transistors.

4. A level shift circuit of claim 1 wherein said means to activate is a resettable memory circuit with an input from each of said first and second output nodes and an output to each of said first and second upper transistors.

5. A CMOS level shift circuit operating from ground to a positive voltage, comprising:
   first and second input nodes;
   first and second input pull-down transistors connected from said first and second input nodes to ground;
   first and second input pull-up transistors connected from said first and second input nodes to a positive voltage;
   first and second output nodes;
   first and second output pull-down transistors connected from said first and second output nodes to ground;
   first and second output pull-up transistors connected from said first and second output nodes to a positive voltage;
   said first input node activating said second output pull-up transistor;
   said second input node activating said first output pull-up transistor;
   first inverter with input and output, and output connected to said first output pull-down transistor;
   second inverter with input and output, and output connected to said second output pull-down transistor;
   first, second, third and fourth NAND gates, each with first and second inputs and an output;
   said first output node connected to first inputs of said first and third NAND gates;
   said second output node connected to first inputs of said second and fourth NAND gates;
   said output of said first NAND gate connected to said second inputs of said second and third NAND gates;
   said output of said second NAND gate connected to said second inputs of said first and fourth NAND gates;
   said output of said third NAND gate connected to said first input pull-up transistor and to said input of said second inverter; and
   said output of said fourth NAND gate connected to said second input pull-up transistor and to said input of said first inverter.

* * * * *